United States Patent [19]
Heinzelmann

[11] Patent Number: 5,490,166
[45] Date of Patent: Feb. 6, 1996

[54] DATA MUTING METHOD AND APPARATUS USING DELAY CIRCUITS FOR COMMUNICATION SYSTEMS

[75] Inventor: David W. Heinzelmann, Bedford, Tex.

[73] Assignee: Motorola, Inc., Schaumburg, Ill.

[21] Appl. No.: 183,681

[22] Filed: Jan. 19, 1994

Related U.S. Application Data

[63] Continuation of Ser. No. 590,862, Oct. 1, 1990, abandoned.

[51] Int. Cl.$^6$ .................................................. H04L 25/00
[52] U.S. Cl. ...................... 375/217; 455/212; 455/225
[58] Field of Search .................................. 375/216, 316, 375/217, 346, 350; 455/35.1, 212, 218, 221–222, 225

[56] References Cited

U.S. PATENT DOCUMENTS

| | | | |
|---|---|---|---|
| 3,665,107 | 5/1972 | Kopec et al. | 375/217 |
| 3,852,671 | 12/1974 | Risley | 455/218 |
| 3,909,727 | 9/1975 | Hughes et al. | 375/217 |
| 3,939,431 | 2/1976 | Cohlman | 375/217 |
| 3,979,679 | 9/1976 | Bush et al. | 455/218 |
| 4,066,845 | 1/1978 | Kishi | 455/212 |
| 4,143,325 | 3/1979 | Kahn | 455/222 |
| 4,154,980 | 5/1979 | Schmidt et al. | 455/244.1 |
| 4,521,917 | 6/1985 | Holt | 455/225 |
| 4,972,510 | 11/1990 | Guizerix et al. | 455/218 X |
| 5,151,922 | 9/1992 | Weiss | 375/217 |

*Primary Examiner*—Young T. Tse
*Attorney, Agent, or Firm*—M. Mansour Ghomeshi

[57] ABSTRACT

A receiver 700 having an audio output device 326 is disclosed. The receiver 700 receives a carrier signal modulated with data, voice, or a combination of both. The receiver 700 includes a demodulator 708 for demodulating the received carrier signal. The demodulated audio signal 302 is coupled to a delay circuit 300 where it is delayed and coupled to a detector 318. The detector 318 detects the presence of data or voice in the demodulated audio signal 302 and mutes or unmutes the audio output device 326 respectively. The delay circuit 300 stops any portion of the data signal to reach the audio output device 326.

2 Claims, 5 Drawing Sheets

DATA MUTING METHOD AND APPARATUS USING DELAY CIRCUITS FOR COMMUNICATION SYSTEMS

This is a continuation of application Ser. No. 07/590,862, filed on Oct. 1, 1990 and now abandoned.

TECHNICAL FIELD

This invention relates generally to receivers and transceivers in communication systems and more specifically to receivers receiving data and voice signals.

BACKGROUND

In communication systems that utilize voice channels for data transmissions it is necessary to mute the data in the receiver to prevent the radio user from hearing it. In the prior art, data muting in receivers typically has been accomplished by detecting the presence of a data signal and then muting the output of the receiver so that it is not heard. Many different techniques exist for detecting the presence of the data signal, such as, for example, those described in U.S. Pat. Nos. 3,758,860, 3,939,431, 4,197,502, 4,233,565, 4,229,822, and 4,430,742. Most of the foregoing prior art techniques require the reception of several bits in order to detect the data signal. Since a finite amount of time is needed for the detection of data, a short data burst is always passed to a listener.

Some systems use a data operated squelch (DOS) tone as a preamble to the data to inform the receiver circuitry of an arriving data signal. This DOS tone is detected via a detector circuit which subsequently acts to mute the speaker so as to prevent the user from hearing the received data. FIG. 1 shows a block diagram 100 of one such mute circuit.

A demodulated signal 102 is routed to a buffer 106 and a detector 108 via a signal line 104. The output of the buffer 106 is coupled to the input of an audio mute gate 112. The detector 108 detects the presence of data or DOS tone and directs the mute gate 112 via the gate control line 110 to open so as to prevent the gated audio 114 from getting to an amplifier 115 and a speaker 116.

In general the detector 108 takes a finite amount of time to detect the presence of a DOS tone and assert the gate control line 110. In addition, there is a finite reaction time for the audio mute gate 112 to react to the state of the gate control line 110. During this finite time period, however short, a data burst will get to the speaker 116. FIG. 2 shows a timing diagram depicting the passage of some data through the audio mute gate 112. Time $t_a$ 202 is the reaction time of the detector 108 when data is present. Time $t_b$ is the attack time of the audio mute gate 112. Times $t_c$ and $t_d$ are the data absent detect time and the audio mute gate release time respectively. As is apparent from the timing diagram 200, a data burst 210 equal in time to the sum of $t_a$ 202 and $t_b$ 204 is passed through the audio mute gate 112 and heard on the speaker 116. Furthermore, a portion of the voice signal equal in time to the sum of the two times $t_c$ 206 and $t_d$ 208 is missed.

The data burst 210 and the missing of a portion of the voice signal are annoying to the user and are therefore undesirable. It is clear that a need exists for a means to differentiate the data signals from voice and prevent them from reaching the speaker 116. Several means are available to provide a solution to this problem, however all with various deficiencies.

Receivers of some communication systems assume that data is not present and then mute the speaker on the detection of data. This is depicted in FIG. 2. Other systems assume that data is present and mute the audio. Upon detection of no data (voice), the system would unmute the audio. The problem with this approach is that the first part of the transmission is muted while determining whether it is data or not. Another problem with this solution is that in some data/voice systems there is a post-Push To-Talk (post PTT) ID sent with each transmission. In such systems, portions of the post PTT ID will be heard on the speaker due to the finite time required for the detection of data.

A second solution would use a high Q notch filter in systems where DOS tones are employed. Since DOS tones are audio tones in the voice spectrum a portion of the voice spectrum is filtered as well. The impact of this filtering of the voice spectrum varies from person to person. While it would not render the voice message unintelligible, it would distort the sound of the person to the point where they could be unrecognizable.

Therefore, there exists a long felt need for a means to effectively, and without any side effects, eliminate the annoying data bursts heard on a speaker in a data/voice communication system.

SUMMARY OF THE INVENTION

Briefly, according to the invention, a receiver having an audio output device is disclosed. The receiver receives a carrier signal modulated with data, voice, or a combination of both signals. A demodulator included in the receiver demodulates the received carrier signal and routes the demodulated signal to a delay circuit. The output of the demodulator circuit is connected to a detector where the presence of a voice signal is detected while the demodulated signal is delayed. Upon such detection of the voice signal a coupler controlled by the detector circuit couples the delayed signal to the audio output device of the receiver.

In other aspects of this invention the above detector circuit detects the presence of a data signal while the demodulated signal is delayed by the delay circuit. Upon such detection a coupler controlled by the detector circuit decouples the delayed signal from the audio output device of the receiver.

BRIEF DESCRIPTION OF THE DRAWINGS

The essentials of the present invention would better be understood by the following diagrams.

DETAILED DESCRIPTION OF THE PREFERRED EMBODIMENT

Figure 1:
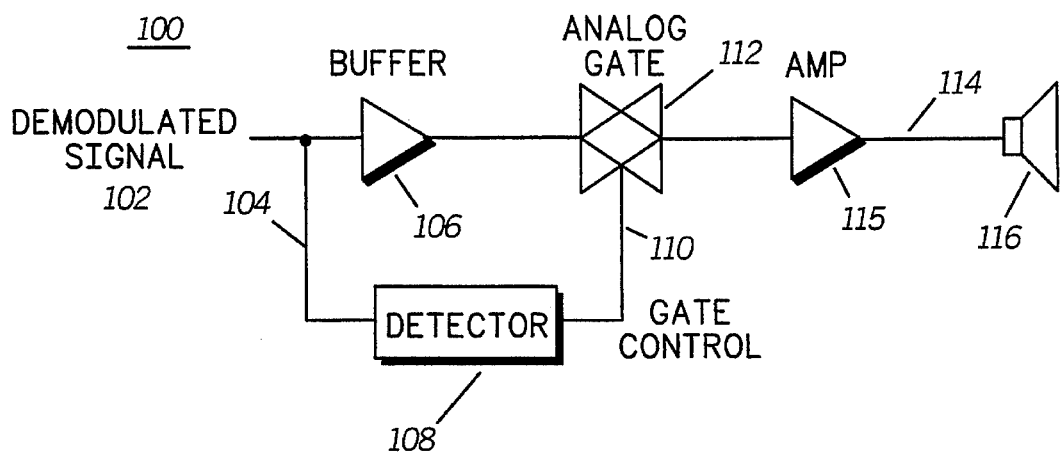
FIG. 1 shows a typical data mute circuit used in present data/voice communication systems.
Figure 2:
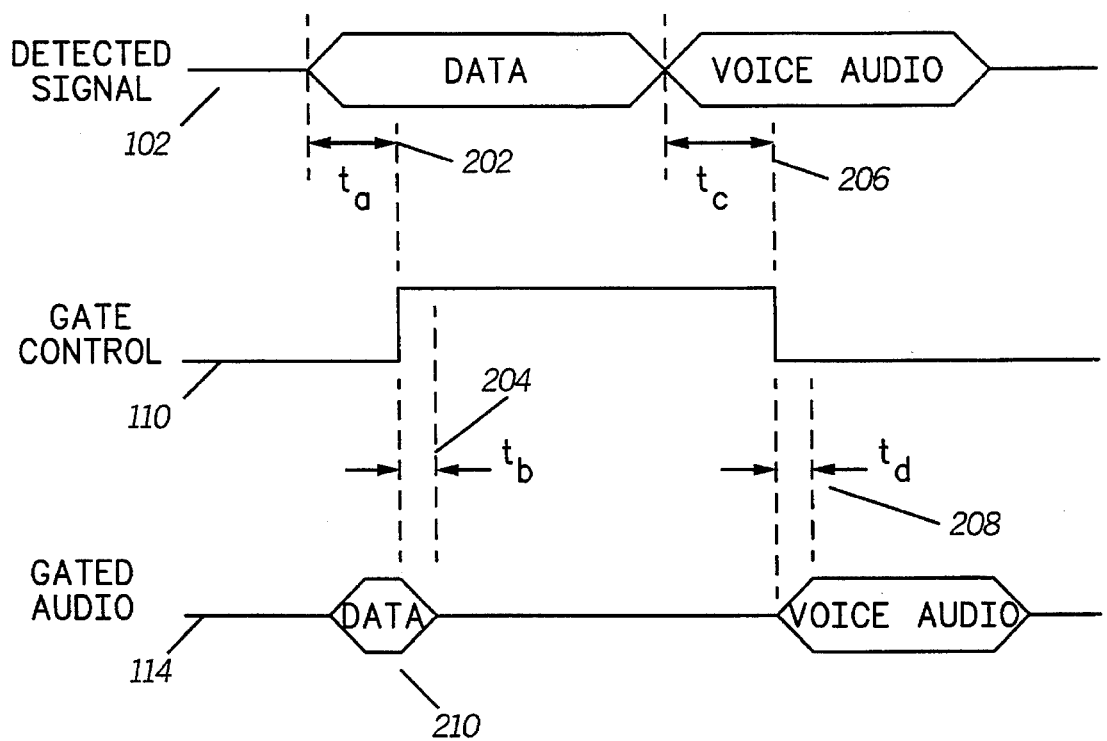
FIG. 2 shows a timing diagram associated with the mute circuit of FIG. 1.
Figure 3:
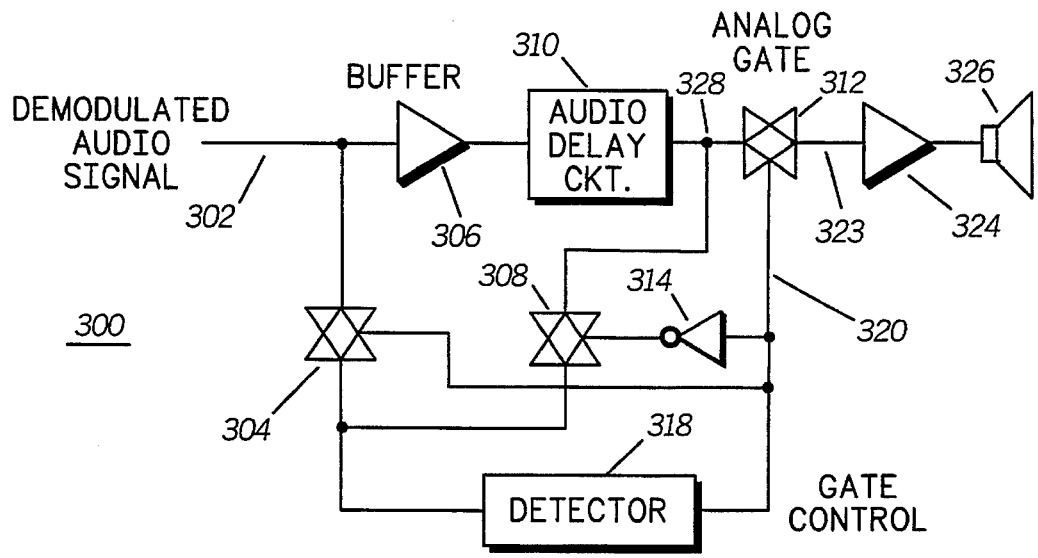
FIG. 3 shows a block diagram of the data mute with delay circuit in accordance with the present invention.

Referring to FIG. 3, a block diagram 300 of a data mute with delay circuit is shown in accordance with the present invention. A demodulated audio signal 302 is routed to a buffer 306 and an analog gate 304. The output of the buffer 306 is coupled to the input of an audio delay circuit 310 whose output is coupled to the inputs of analog gates 312 and 308. The output of the analog gate 304 is coupled to the input of a detector 318. The analog gates 304 and 312 are controlled via the control line 320 coupled to the output of the detector 318. The analog gate 308 is controlled by the inverse of the output of the detector 318 via an inverter 314. The output signal of the analog gate 312 is applied to an amplifier 324 in route to an audio output device, speaker 326.

To better understand the operation of the data mute with delay circuit 300 the following conventions are established:

an analog gate is closed when it is in a state that passes audio signals.

an analog gate is open when it is in a state that prevents the passage of an audio signal.

data detect time $t_{dd}$ is the time required by the detector 318 to detect the presence of a data signal.

gate open time $t_{go}$ is the time required by the analog gate 312 to open in reaction to the gate control line 320.

voice detect time $t_{vd}$ is the time required by the detector 318 to detect the absence of data signal.

gate close time $t_{gc}$ is the time required by the analog gate 312 to close in reaction to the gate control line 320.

detector/gate attack time ($t_{att}$) is the sum of the data detect time $t_{dd}$ and the gate open time $t_{go}$.

detector/gate release time ($t_{rel}$) is the sum of the voice detect time $t_{vd}$ plus the gate close time $t_{gc}$.

an audio signal is a data signal, a voice signal, or a combination of both such signals.

The standby state of the data delay with mute circuit 300 is defined as the state with no demodulated audio signal at its input. This state is in response to the absence of a carrier signal at the antenna of a receiver that the data delay with mute circuit 300 is a part of.

In the standby state the analog gates 304 and 312 are closed and the analog gate 308 is open. With the analog gate 304 closed the arriving demodulated audio signal 302 is coupled to the detector 318. The audio delay circuit 310 delays the demodulated audio signal 302 and does not allow it to reach the analog gate 312 therefore stopping signals from getting to the speaker 326. The delay time of the audio delay circuit 310 is equal to $t_{att}$ plus a safety margin. During this delay the detector 318 analyzes the demodulated audio signal 302 for the presence of any data signals. Once such data signals have been detected, the control line 320 commands the analog gates 312 and 304 to open. The control line 320 also commands the gate 308 to close via the inverter 314. With the analog gate 312 open no data signal reaches the speaker 326, otherwise the speaker 326 remains muted. The decoupling of data signals from the speaker 326 continues for the duration of the data signal. Indeed if no voice signal is following the data signal, the speaker 326 is muted until the reception of another demodulated voice audio signal. With the analog gate 304 open and the analog gate 308 closed the delayed audio 328 is coupled to the input of the detector 318. The analysis of the delayed audio 328, rather than the demodulated audio signal 302, helps to prevent the trailing edge of the detected data to reach the speaker 326.

On the other hand with the detection of a voice signal the detector 318 proceeds to leave the analog gates 304 and 312 closed and the analog gate 308 open. After a delay equal to $t_{att}$ the audio delay circuit passes the demodulated audio signal 302, which has been determined to be voice, to the analog gate 312. The output voice signal 323 of the analog gate 312 is subsequently amplified by the amplifier 324 and coupled to the speaker 326. The speaker 326 is referred to as being unmuted at this point and remains unmuted for the duration of the voice signal.

In circuits where $t_{att}$ is longer than $t_{rel}$ a portion of the data signal equal in time to the difference of $t_{att}$ and $t_{rel}$ may be heard on the speaker 326. However, as stated earlier; in the presence of data, the analog gates 304 and 308 are open and closed respectively. Therefore allowing the detector 318 to monitor the output of the audio delay circuit 310 instead of the demodulated audio signal 302. Under these circumstances and regardless of timing, the entire trailing edge of the detected data is processed by the detector 318 before the control line 320 is asserted to close the analog gate 312.

In some applications a micro-processor may be used to run a software program to control the operation of the data delay and mute circuit 300. In these applications, the software program may be designed to control the $t_{rel}$ time and force it to be longer than the $t_{att}$ time. With such software manipulation the need for the two analog gates 304 and 308 and the inverter 314 is removed and they may be eliminated. The elimination of the analog gates 304 and 308 and the inverter 314 routes the demodulated audio signal to the input of the detector 318 continuously. The operation of the circuit continues to remain the same otherwise.

Figure 4:
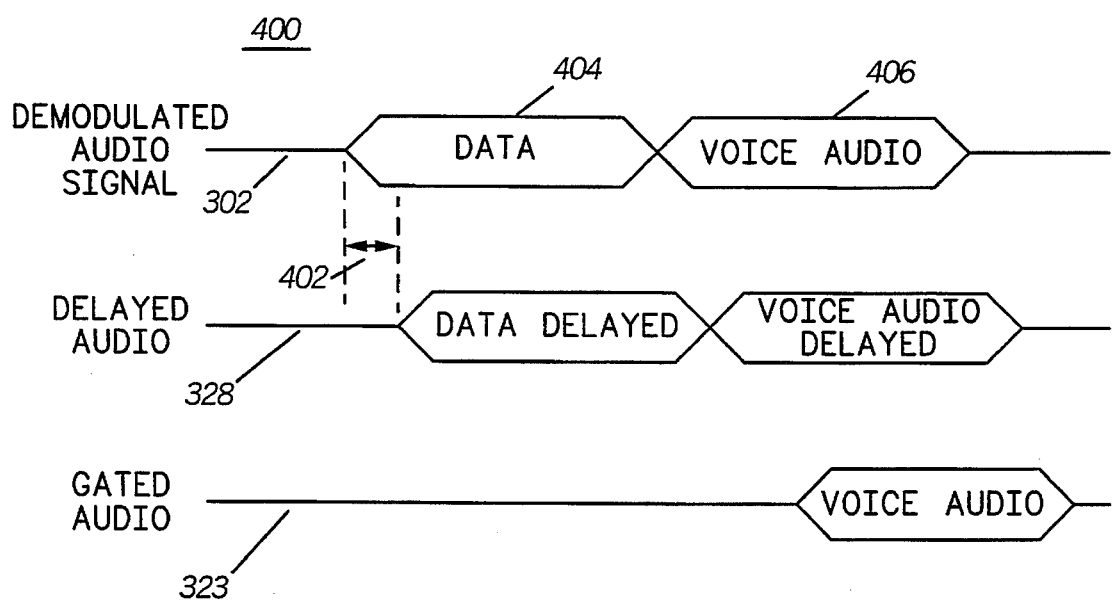
FIG. 4 shows a timing diagram associated with the data mute with delay circuit of FIG. 3.

Referring to FIG. 4 a timing diagram 400 of the operation of the data mute with delay circuit 300 is shown. The demodulated audio signal 302 is a combination of data and voice. The demodulated audio signal 302 is delayed by the audio delay circuit 310 for a time period 402 while the presence of a data signal 404 is being detected by the detector 318. In the mean time the analog gate 312 is open due to the detection of the data 404 and its output gated audio 323 has no data contents. At this time the analog gate 308 is closed and is supplying delayed audio to the detector 318. At the completion of the delayed data signal 404 and the start of the delayed voice audio 406, the detector 318 directs the analog gate 312 to close. This insures that no data is routed to the speaker as shown by the gated audio 323 line of FIG. 4.

Figure 5:
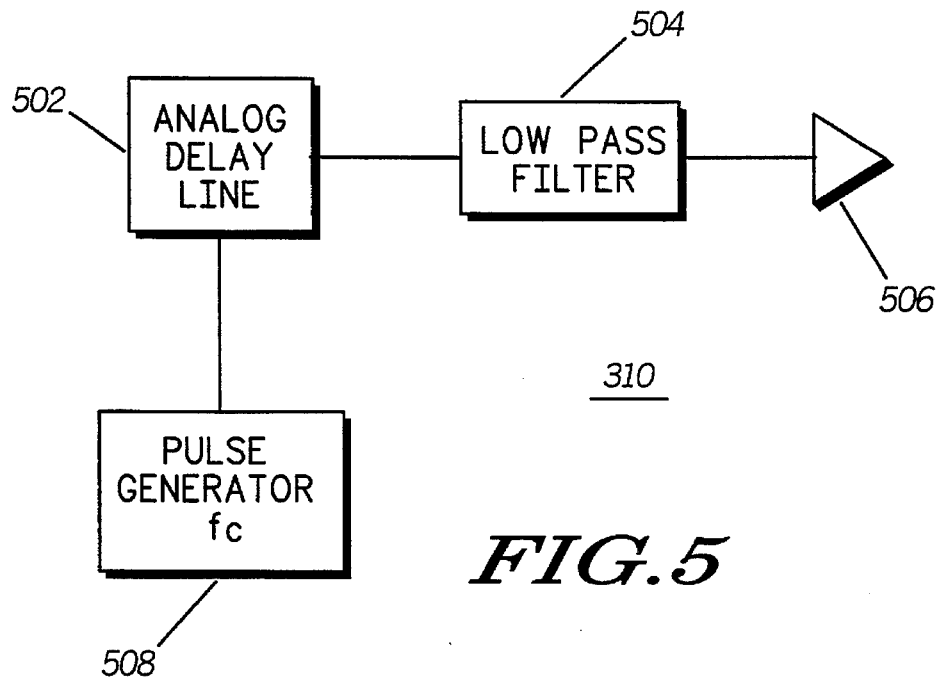
FIG. 5 shows a block diagram of an audio delay circuit in accordance with the present invention.

FIG. 5 shows a block diagram of an audio delay circuit 310 including an analog delay line 502, a low pass filter 504, an amplifier 506, and a pulse generator 508. The pulse generator 508 provides a clock $f_c$ to the analog delay line 502. The output of the analog delay line 502 is filtered by the low pass filter 504 and subsequently amplified by the amplifier 506.

The analog delay line 502 is an RD5108A from EG & G RETICON semiconductors. The pulse generator 508 is a 555 timer based clock oscillator. The lowpass filter 504 and the amplifier 506 may be combined using operational amplifiers.

Figure 6:
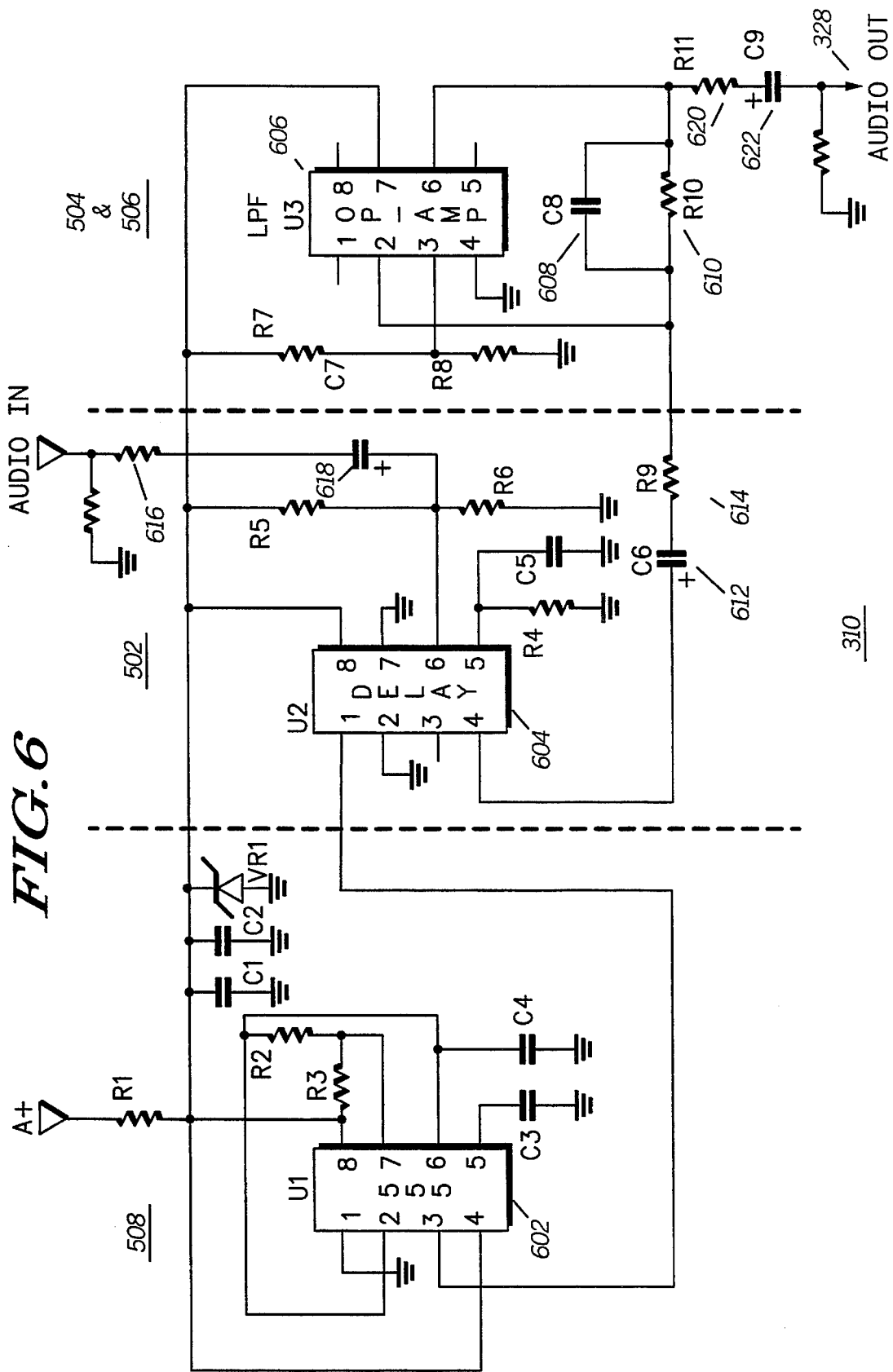
FIG. 6 shows a schematic diagram of an audio delay circuit in accordance with the present invention.

Referring now to FIG. 6, a schematic diagram of the audio delay circuit 310 is shown. For ease of explanation the circuit 310 is divided in three sections as outlined in the block diagram of FIG. 5. The circuit 310 is comprised of the analog delay line 502, pulse generator 508, low pass filter 504, and the amplifier 506. The clock frequency is determined by the delay desired using the following equation:

$$fc = \frac{2048}{\text{delay time desired}}$$

To achieve a delay of 60 msec., a clock frequency of 34,133 KHz is needed. The pulse generator block 508 is comprised of a 555 timer with its associated circuitry. The operation of the 555 timer circuits is well known in the art.

The delay line circuit 502 includes a delay IC 604 which is RD5108A from EG & G RETICON semiconductors. The RD5108A is a 1024 sample bucket brigade device. It contains internal clock drivers that can accept TTL or higher, single phase input ($f_c$). Internal sample-and-hold provides a smooth stair step output over each sample period in normal operation. The delay time is controlled by the clock $f_c$ and can be as high as 4 seconds to less than 1.3 msec. For a more detailed explanation of the operation of the RD5108A the reader is referred to the EG & G RETICON manual dated May 1987.

The amplifier 506 and the filter 504 are realized by the operational amplifier 606. The low pass filter is used to eliminate any noise in the audio path that is generated by the sampling clock. To attenuate the 34 KHz clock noise by 20 dB a simple 2 pole Butterworth filter with a corner at 3 KHz is used. This filter along with the audio shaping circuit and the natural attenuation of the human audio system should be sufficient attenuation of the noise. A resistor 610 in parallel with a capacitor 608 form the negative feed back for the operational amplifier 606. The demodulated audio signal 302 after being buffered by the buffer 306 is routed to the input of the delay IC 604 pin 6 via a resistor 616 and a capacitor 618. The delay circuit 502 using the pulses generated by the generator 508 delays the demodulated audio signal 302 for a specific period (60 msec in this example). The delayed audio is available at pin 4 of the delay IC 604 is connected to pin 2, the inverting input of the operational amplifier 606 through a capacitor 612 and a resistor 614. The operation amplifier 606 after filtering and amplifying the input signal produces the delayed audio 328 via a resistor 620 and a capacitor 622.

Figure 7:
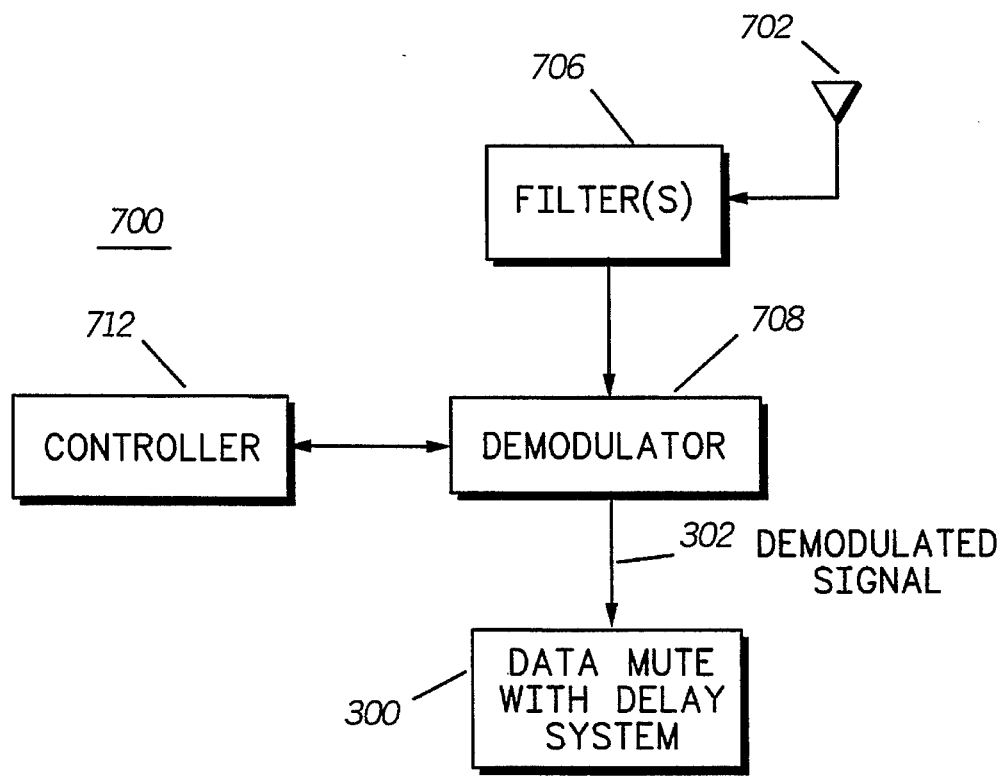
FIG. 7 shows a block diagram of a receiver in accordance with the present invention.

Referring to FIG. 7 now, a block diagram of a receiver 700 is shown in accordance with the present invention. To better focus on the invention, this simplified receiver shows neither an RF amplifier stage nor an IF stage for the conversion of the received RF signal. Either of these stages may be included if necessary for the intended operating environment. A received signal containing voice, data, or a combination of both is received by the antenna 702 and filtered by the filter(s) 706. Filtered signals are routed to the demodulator 708. The demodulator 708 may be of conventional design and is used to demodulate incoming signals to produce the demodulated signal 302. The demodulated signal 302 is routed to the data mute with delay circuit 300. At the data mute with delay circuit 300 the demodulated signal 302 is delayed via the delay circuit 310 while its various components are detected by the detector 318. The delay time can vary from one system to another. Typically a minimum delay equal to the detect time of the detector 318 plus the response time of the analog gate 312 is required. The analog gate 312, included in the data mute with delay circuit 300, is a coupler used to couple voice contents of the demodulated audio signal 302 to the buffer 324 and the speaker 326 which is the audio output device of the receiver 700. This coupling results in the speaker 326 being unmuted. The analog gate 312 remains closed for the duration of the received voice signal. The analog gate 312 opens only if data has been detected or the carrier signal has ceased. Furthermore the analog gate 312 is normally open in the absence of any carrier signal. This is necessary so as to avoid noise being heard on the speaker 326.

Data signals, after being detected by the detector 318, are decoupled from the speaker 326 via the analog gate 312. The decoupling continues for the duration of the data signal. This decoupling results in the speaker 326 being muted. A controller 712 receives data signals from the demodulator 708. The controller 712 processes the incoming data signals and presents them to the user. Typically, upon the reception of a signal the controller 712 operates to alert the radio user of such a reception. Once the alert signal has been generated, the received signal is presented to the user in a variety of ways depending upon the message type and optional features that may be enabled or disabled.

Those skilled in the art appreciate the availability of other receiver circuits to achieve similar results. The presentation of this receiver should be construed only as an example (and not as a limitation) to further clarify the preferred embodiment of the present invention.

Figure 8:
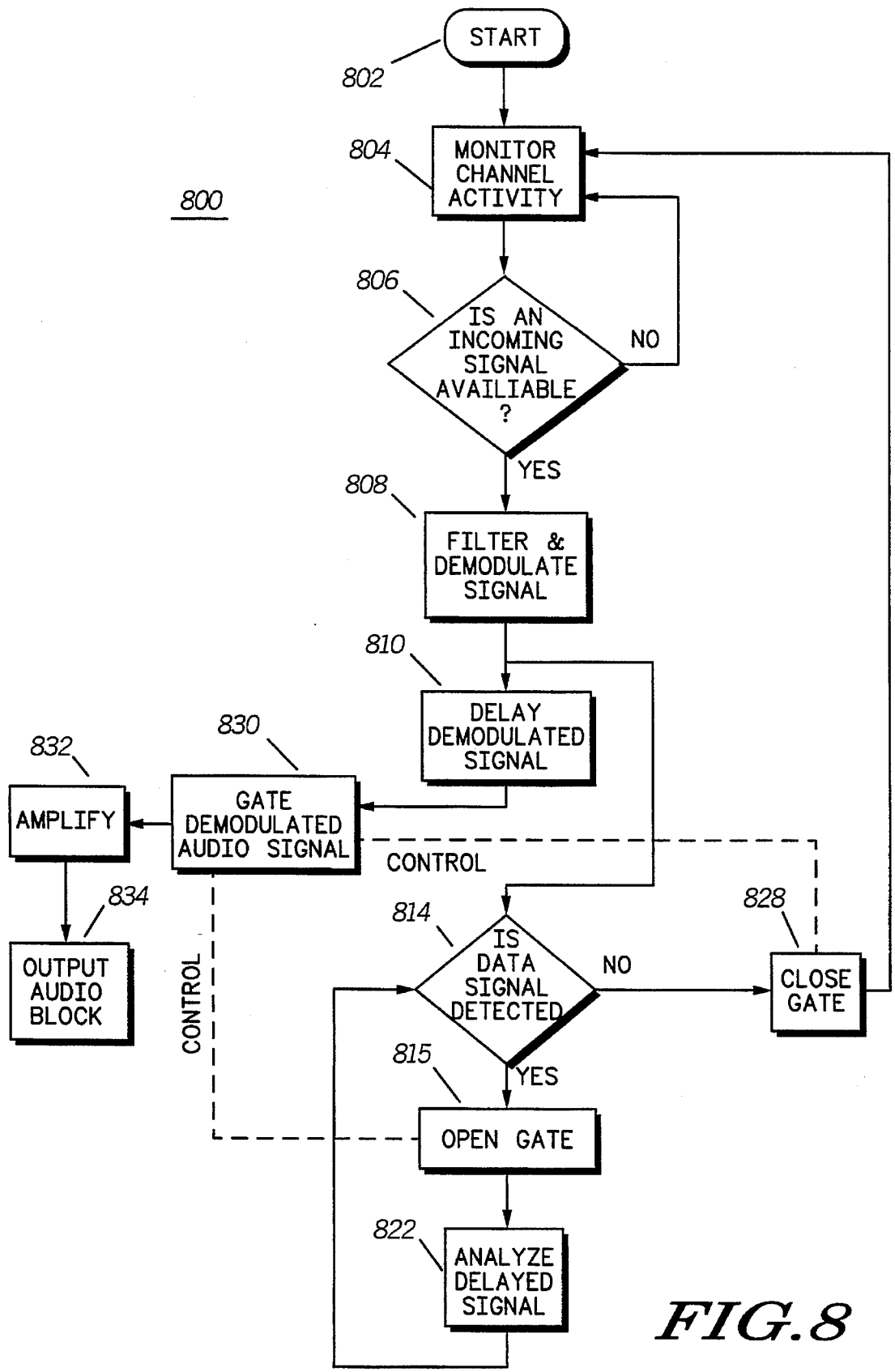
FIG. 8 shows a flow chart of the operation of a receiver in accordance with the present invention.

FIG. 8 is a flow chart of the operation of the receiver 700. The start block 802 is connected to the monitor channel activity block 804 where the activity of the channel is monitored. The output of the monitor channel activity block 804 is connected to a decision block 806. At the condition block 806 a decision is made whether a signal has been received. The NO output of the decision block 806 returns to the monitor block 804 resuming the monitoring of the channel activity. The YES output of the decision block 806 is connected to a filter and demodulate signal block 808. The block 808 filters and demodulates the incoming signal to produce a demodulated audio signal. The output of block 808 is connected to a delay demodulated signal 810 where the demodulated audio signal 302 is delayed for a certain time interval. The output of block 810 is connected to a gate demodulated audio signal block 830. This block 830 controls the flow of the delayed demodulated audio signal to an audio output device. The controls for the block 830 are routed from an open gate block 815 and a close gate block 828. The output of block 830 is connected to an amplify block 832 whose output is connected to an output audio block 834.

The output of the filter and demodulate signal block 808 is connected to a decision block 814 where the presence of data signal is detected. The NO output of the decision block 814 is connected to the close gate block 828. The output of the close gate block 828 is a control signal and is connected to the gate demodulated audio signal 830. A control signal from close gate block 828 commands block 830 to close its gate and route the delayed demodulated signal to the amplifier block 832 in route to the output audio device of block 834. The output of the close gate 828 is connected to the monitor channel activity block 804.

The YES output of the decision block 814 is connected to an open gate block 815. A control signal from open gate block 815 commands block 830 to open its gate and prevent the delayed demodulated signal from getting to the amplifier block 832 thereby stopping the flow of data to the output audio device of block 834. The output of the open gate block 815 is connected to an analyze delayed signal block 822 where the delayed detected audio signal 328 is analyzed for data components. The analysis of the delayed demodulated audio signal 328 is mainly intended to detect the trailing edge of the demodulated audio signal. The output of the analyze delayed signal 822 is connected to the decision block 814 where the presence of data in the delayed signal is detected. The output of the close gate 828 is connected to the monitor channel activity block 804.

Those skilled in the art will recognize that various modifications and changes could be made with respect to the above described invention, without departing from the spirit and scope of the invention as set forth. Therefore, it should be understood that the claims are not to be considered as limited to the particular embodiments set forth in the absence of specific limitations expressly incorporating such embodiments.

What is claimed is:

1. In a receiver having an audio output device and adapted to operate in a mixed data and voice communication system, a method for preventing data components from reaching the audio output device, comprising the steps of:

receiving and demodulating a carrier signal to produce a demodulated signal;

delaying said demodulated signal for a time interval to produce a delayed audio signal;

detecting the presence of a data signal in the demodulated signal; and de-coupling the delayed audio signal to the audio output device in response to the step of detecting in order to prevent the data signal from reaching the audio output device and provide for the recovery of the voice signal in its entirety.

2. The method of claim 1, wherein the step of de-coupling the delayed audio signal to the input of said audio output device continues for the duration of said voice signal.

* * * * *